United States Patent [19]
Plesko

[11] Patent Number: 5,880,452
[45] Date of Patent: Mar. 9, 1999

[54] LASER BASED PCMCIA DATA COLLECTION SYSTEM WITH AUTOMATIC TRIGGERING FOR PORTABLE APPLICATIONS AND METHOD OF USE

[75] Inventor: George A. Plesko, Media, Pa.

[73] Assignee: GEO Labs, Inc., Media, Pa.

[21] Appl. No.: 910,257

[22] Filed: Aug. 13, 1997

Related U.S. Application Data

[63] Continuation of Ser. No. 483,299, Jun. 7, 1995, abandoned, which is a continuation-in-part of Ser. No. 144,646, Oct. 28, 1993, Pat. No. 5,506,394, which is a continuation-in-part of Ser. No. 6,754, Jan. 21, 1993, Pat. No. 5,464,291, which is a continuation-in-part of Ser. No. 612,983, Nov. 15, 1990, Pat. No. 5,187,612, said Ser. No. 483,299, Jun. 7, 1995, is a continuation-in-part of Ser. No. 273,101, Jul. 8, 1994, Pat. No. 5,596,442, which is a division of Ser. No. 6,754, Jan. 21, 1993, Pat. No. 5,464,291, said Ser. No. 483,299, Jun. 7, 1995, is a continuation-in-part of Ser. No. 332,629, Oct. 31, 1994, Pat. No. 5,596,446, said Ser. No. 483,299, Jun. 7, 1995, is a continuation-in-part of Ser. No. 229,728, Apr. 19, 1994, Pat. No. 5,550,367.

[51] Int. Cl.$^6$ .................................................. G06K 71/10
[52] U.S. Cl. ........................................ 235/472; 235/492
[58] Field of Search ................................ 235/472, 462, 235/487, 488, 492; 250/566

[56] References Cited

U.S. PATENT DOCUMENTS

| | | | |
|---|---|---|---|
| 4,922,111 | 5/1990 | Kuwano et al. | 250/566 |
| 5,189,291 | 2/1993 | Siemiatowski | 235/472 |
| 5,315,097 | 5/1994 | Collins, Jr. et al. | 235/472 |
| 5,350,909 | 9/1994 | Powell et al. | 235/472 |
| 5,468,952 | 11/1995 | Alexander et al. | 235/492 |

*Primary Examiner*—Anita Pellman Gross
*Assistant Examiner*—Karl Frech
*Attorney, Agent, or Firm*—Reed Smith Shaw & McClay LLP

[57] ABSTRACT

A high speed non-contact beam scanning data acquisition memory card is disclosed. The device possesses the ergonomic benefits of a a card, yet can scan a wide angle moving beam across an information-bearing target in one or two dimensional scan patterns such as lines, rasters or other patterns in order to read information therefrom. The device is well suited for reading one or two dimensional bar-code or other printed matter where great portability as in medical records acquisition is desired. In order to achieve the high density electro-optical packaging necessary for its high performance to size ratio the present device employs a low profile scan module which is turned on by novel methods. Collected information is processed by signal processing electronics and stored in solid state low power memory devices. Novel triggering and scan actuating methods are also disclosed as are novel integrated scanning applications. In one embodiment components are integrated into a thin PCMCIA card or pen type scan device. Communication from the device is achievable by a cable or by wireless means.

2 Claims, 11 Drawing Sheets

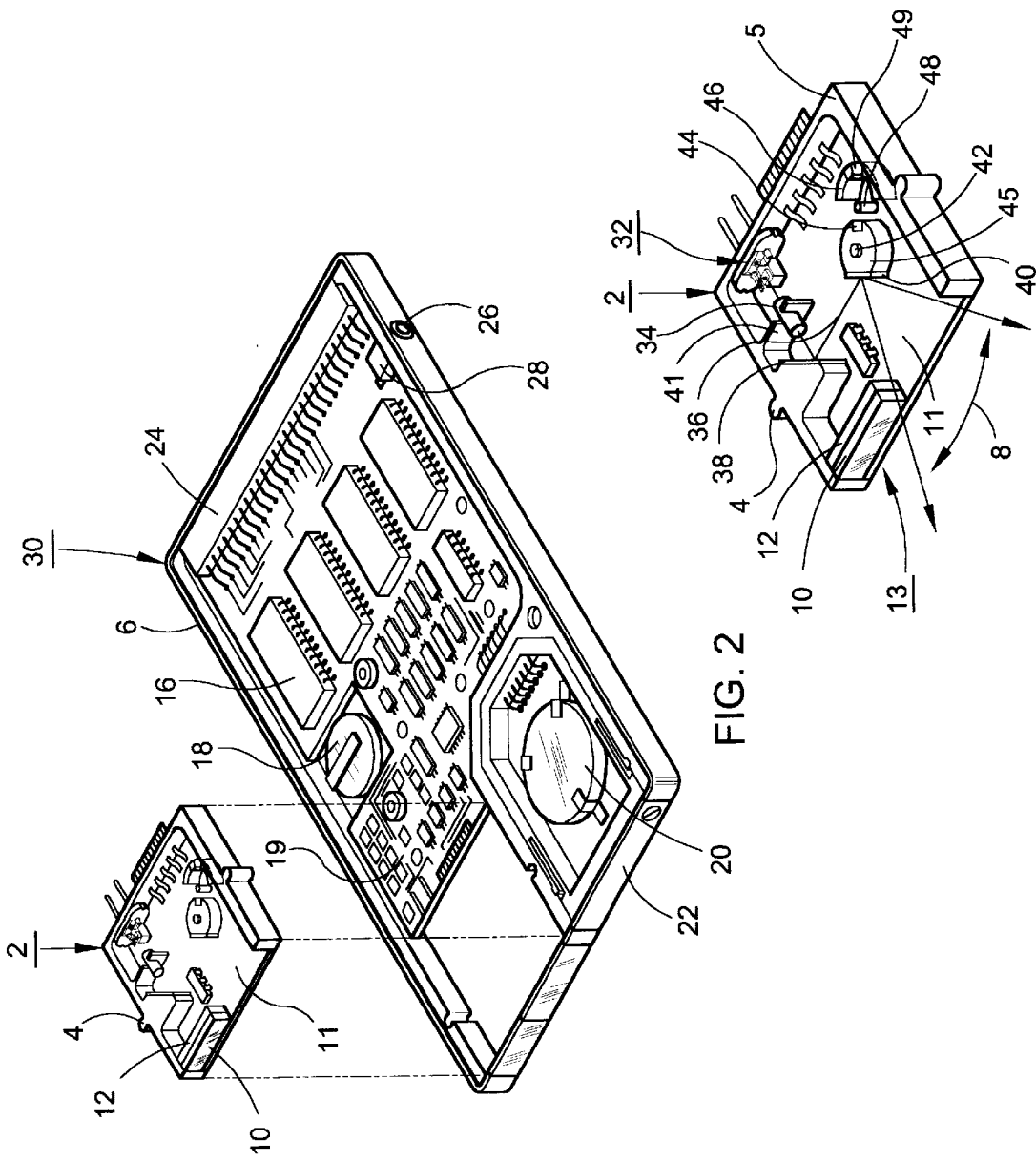

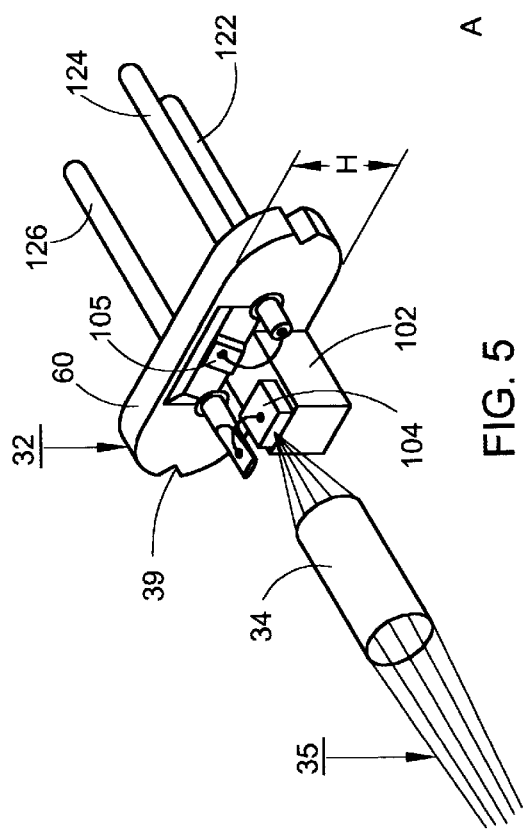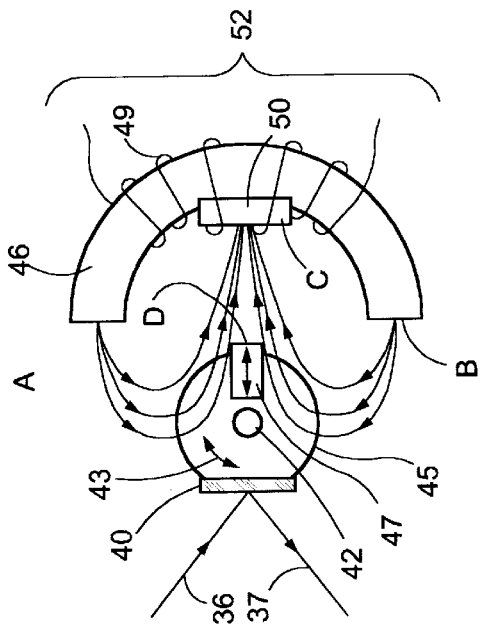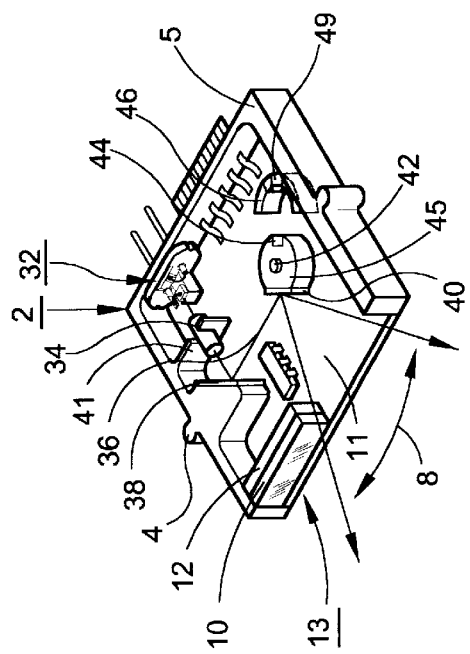

LASER BASED PCMCIA DATA COLLECTION SYSTEM WITH AUTOMATIC TRIGGERING FOR PORTABLE APPLICATIONS AND METHOD OF USE

This application is a continuation of U.S. patent application Ser. No. 08/483,299 filed Jun. 7, 1995 now abandoned (hereinafter, "the '299 application"), the '299 application is a continuation-in-part of U.S. patent application Ser. No. 08/144,646 entitled "Light Beam Scanning Pen, Scan Module for the Device and Method of Utilization", filed Oct. 28, 1993, now U.S. Pat. No. 5,506,394, which is a continuation-in-part of U.S. patent application Ser. No. 08/006,754 filed Jan. 21, 1993, now U.S. Pat. No. 5,464,291, which is a continuation-in-part of U.S. patent application Ser. No. 07/612,983 filed Nov. 15, 1990, now U.S. Pat. No. 5,187,612, entitled "Gyrating Programmable Scanner", the '299 application is also a continuation-in-part of U.S. patent application Ser. No. 08/273,101 filed Jul. 8, 1994, now U.S. Pat. No. 5,596,442, which is a division of U.S. patent application Ser. No. 08/006,754 filed Jan. 21, 1993, now U.S. Pat. No. 5,464,291, the '299 application is also a continuation-in-part of U.S. patent application Ser. No. 08/332,629 entitled "Ultra Compact Scanning System for a Wide Range of Speeds, Angles and Field Depth" filed Oct. 31, 1994, now U.S. Pat. No. 5,596,446, the '299 application is a continuation-in-part of U.S. patent application Ser. No. 08/229,728, filed Apr. 19, 1994, now U.S. Pat. No. 5,550,367.

BACKGROUND OF THE INVENTION

1. Field of the Invention

The field of beam scanning for the purpose of gathering information is rapidly advancing. The commercial application and importance of bar-code reading is well known and is now becoming more sophisticated with the introduction of high density two dimensional bar-code. Code 49, Code 1, and PDF 417 are examples of new bar-code standards that contain information in a two dimensional array.

As information densities increase, scanning with high speed scan patterns becomes necessary in order to read them rapidly. In addition to bar-code reading, the ability to read alphanumeric information is also of great commercial value. Other types of encoded information are being devised, and object recognition requiring scanning readout equipment is also commercially important.

As sophisticated portable requirements expand, the demand for ever smaller, high performance, portable hardware increases, including miniature equipment which scans, stores and also processes data during collection.

The present invention provides a portable non-contact moving beam scanning device small enough to be included into a credit card size data collection and storage instrument. The device is able to automatically scan a moving beam across a distant target containing information such as printed bar-code. A novel ultra-thin scan element, makes possible the inclusion of a scanner in a small storage device configured as a card. The scanning speeds may range from tens of scans per second to thousands of scans per second, at angles of forty degrees or more and scanning in two dimensions is also possible.

Configured as a card scanner, the invention contains an integrated light source (such as a diode laser), a beam focusing means, and a light collector coupled to an information processing means for extracting information from the reflected light, as well as portable memory means to store collected information, record time, and to store other data. A processing means may also be included in the card scanner so that collected data may be processed or verified while the device is in use. A clock is also included in various embodiments of the card scanner to record the time of certain events or time of data collection. Various methods for activating the scan sequence are also disclosed for turning the device on and off while capturing data with a minimal expenditure of time and power.

The entire scanning and data collection system can be fit into a PCMCIA card or other miniature housing, making possible the development of a new generation of compact laser scanning implements and terminals not previously available. The present invention overcomes the contact limitations and prohibitively large size of prior art devices such as those using contact-scan methods or pistol grip laser scanning bar code terminals.

In particular, the invention relates to integrated beam scanning modules which can also be easily fabricated in the form of flat or small cylindrical modules which may be "mixed and matched" to suit various ultra miniature scanning requirements in fixed or portable modes.

The present invention also includes in a scanning system able to generate two-dimensional scan patterns such as rasters or omni-directional patterns for reading printed indicia with little regard for orientation of printed material. It can read one or two dimensional high density bar-code targets with no aiming and at significant distances. This is accomplished by means of high speed, wide angle rastering scan patterns.

The present invention further includes methods for using a low mass beam scanner mounted in ways that are impossible or too cumbersome, using current state of the art devices.

The invention also relates to methods for using the scanning system to equip health care professionals with portable data collection systems to record a patients vital signs, time of treatment, medication verification and the like without overburdening users with clumsy clipboards and other instruments.

2. Description of the Prior Art

Integrating portable data storage and processing devices with bar code scanning mechanisms to make a scan terminal has become very popular because of the productivity the combination affords.

Small scan terminals which use a contact type reading head have been successful. The contact type terminals use an optical reflective sensor consisting of a light emitting diode, light source, an electronic photo detector and other optical parts included in a single package. This component combined with a small spherical sapphire tip with an extremely short focal length for focusing light is used as the front end data sensor in the contact style terminals. Such scan components are typically packaged in an industry standard "TO-5" metal sealed housing having a diameter of about 12.3 millimeters. The Hewlett-Packard company is a major producer of these contact scan sensor components.

Videx, Inc. of Corvallis, Oreg. and the Hand Held Products company have produced hand holdable terminals incorporating contact type scan sensors for reading bar code data. Battery powered memory and data processing means included in these terminals has proven to be indispensable for data collection in the parcel delivery industry.

The thickness of these terminals is limited to a dimension somewhat greater than that of the TO-5 contact sensor package and none have an industry standard housing.

Because of the short focal length of the contact sensing elements, these terminals have virtually no depth of field and this major drawback essentially limits these scan terminals to contact reading which limits productivity.

Contact type scan systems are poorly suited to scanning printed material that has damage (as coupons usually do when carried around), or when the surface that is labeled or printed upon is curved, soft, irregular or wrinkled such as mailing pouches, or a hospital patients bar coded identification wrist band.

In order to overcome some of the problems associated with contact readers, portable laser reading guns were developed. These typically read bar-code at distances ranging from inches to several feet. Consequently, these are more effective for reading bar-codes printed on irregular surfaces. The laser scanning guns can be plugged into portable terminals but have the drawback of being far bulkier than contact scan devices. The scan mechanisms of some Scan Guns have been integrated into data terminals with a trigger on a handle such as is described in U.S. Pat. No. 5,059,778 but these are bulky and cannot be carried in a pocket. These also operate at slow scan rates on the order of 40 scans per second and as we shall see this slow scan speed greatly reduces both work and power efficiencies.

Another category of readers for bar-code and printed matter are the so called CCD types or "Charge Coupled Devices", which use an imaging technique for acquiring data and do not contain lasers but are inherently to bulky to be adapted to fit into a card size terminal. Generally, CCD readers must be placed on top of and cover the target bar-code, have poor depth of field and limit the size of bar-codes they can read.

Some laser scanners utilize polygonal mirrors rotated by motors to generate scan lines by reflecting a laser beam off the mirrors as they rotate in front of the beam. Owing to a complex optical path with ample head room requirements for the beam to escape, these scanners are bulky and at best may be packaged in boxes or gun shaped housings, but not smaller.

Reluctance of employees to accept new bar-code scanning applications because of the clumsiness or inconvenience of the equipment is also an important issue. For example, nurses, in the course of their patient care duties have been resistant to the idea of using bulky bar code readers which resemble guns because of their clumsiness and potentially frightening appearance.

None of the known non contact moving beam or CCD scanning systems presently available are small enough to be packaged into a pocket sized housing of credit card size which can automatically scan one or two dimensions in order to read information.

PRIOR ART SCAN SEQUENCE ACTIVATION

U.S. Pat. No. 5,268,564 discloses the use of a magnet and coil arrangement which are integral parts of a scan element itself and are adapted to act as a motion detector when picked up by the user for initiating a scan sequence. This method is therefore limited to low resonant frequency scan mechanisms which inherently require low compliance springs, and unbalanced suspensions. Because these have a resonant frequency on the order of 18 Hz they are susceptible to unwanted triggering when picked up by the user, by quivering of the hand of the user, or otherwise random motions.

These prior art devices are susceptible to false triggering and thereby waste power. Also low frequency externally induced vibrations can cause destructive interference with the scan mirror oscillations causing erratic scanning, degrading operation of the device and more wasted power. U.S. Pat. No. 4,387,297 describes a "shoot and aim" method of scanning a target whereby a manual trigger switch is activated, generating a laser scan line. The user then sees the scan line and uses it as a guide to bring the scan line into coincidence with a barcode target to be read. This method also wastes power and time since the laser and scan mechanism are active during the target search cycle. Commercial implementations of this method have used low speed stepper motors which dither at 18 Hz and do not scan rapidly enough to be used in the novel methods described below. (Stepper motors consume much more power if their speed is increased.)

The present invention uses low power balanced scan elements with high compliance suspensions, high speed scan mechanisms and activation techniques not susceptible to the unwanted effects mentioned above.

A substantial advantage of the methods of the present invention is that scan sequence initiation and truncation need not be placed under microprocessor control as are prior art systems. U.S. Pat. No. 5,130,520 for example teaches use of a microprocessor read control means to evaluate the scan before turning off the scanner in order to reduce user frustration and so on.

Portable microprocessors are known to be power hungry. But with the present invention there is no need to waste microprocessor control time and power to control the scan sequence. The read control methods described in U.S. Pat. No. 5,130,520 were useful in the prior art scan terminals which only scanned at about 36 scans per second to turn them off immediately after a successful scan was finally achieved in order to truncate power consumption. Swiping the slower prior art scanners past a target to be read would not work well since the low scan rates would simply produce a widely spaced zig-zag pattern that would completely miss the target. The elimination of such tedious and compromised methods is eliminated by the present invention.

As will be shown there is no need for this degree of complexity and power consumption in the present invention.

SUMMARY OF THE INVENTION

1. Objects of the Invention

It is a general object of this invention to provide moving light beam non-contact bar-code scan heads with light collectors and circuitry integrated with data collection sensors and data storage devices.

It is another object of this invention to provide a small integrated non contact scan module on the order of three millimeters thick which can fit into a PCMCIA data collection card terminal.

Another object of this invention is to provide a scanning method utilizing a non-contact, wide-angle beam scanning device in which a beam is caused to scan its target many times per second, thereby allowing the user to raster the scan past an area in which a bar-code is located thereby eliminating the need to initiate scanning then carefully position the scan line accurately upon the barcode as is done with prior art portable scanners.

Another object of the invention is to provide power saving actuating and triggering methods adapted for rapid data acquisition in portable beam scan systems.

Still another object of the present invention is to provide automatic methods for initiating scanning and triggering of barcode readers custom adapted to particular applications described herein.

A further object of the invention is to provide compact scan modules and scanning elements packageable into equipment as small as a pen, card, or other light weight data acquisition devices.

Yet another object of the present invention is to provide a medical data gathering terminal in the form of a PCMCIA card for the health care industry.

Another object of the invention is to provide a portable gas sampling head with an integrated barcode reading sensor so that a point having a barcode tag attached may be identified and immediately sampled with a single hand holdable instrument probe.

Yet another object of the invention is to provide a single part low cost lens mounting and focus system with a slim profile preferably smaller in diameter than the base of a commercially packaged laser diode which is field replaceable.

2. Features of the Invention

The novel features that are considered as characteristic of the invention are set forth in the appended claims. The invention itself, however, both as to its construction and its method of operation, together with additional objects and advantages will be best understood from the following description of specific embodiments when read in connection with the accompanying drawings.

BRIEF DESCRIPTION OF THE DRAWINGS

FIG. 2 shows a novel low profile scan engine adapted to fit into the beam scanning card terminal of FIG. 1.

FIG. 3 illustrates details of the internal construction of an ultra thin scan engine similar to the module shown in FIG. 2.

FIG. 4A illustrates details of a preferred, low profile beam scan component.

FIG. 5 illustrates a laser diode and focus element adapted for mounting in the scan module of FIG. 3.

FIG. 9 illustrates a scan module which fits into a PCMCIA card as a module.

DETAILED DESCRIPTION OF THE PREFERRED EMBODIMENTS

Figure 1:
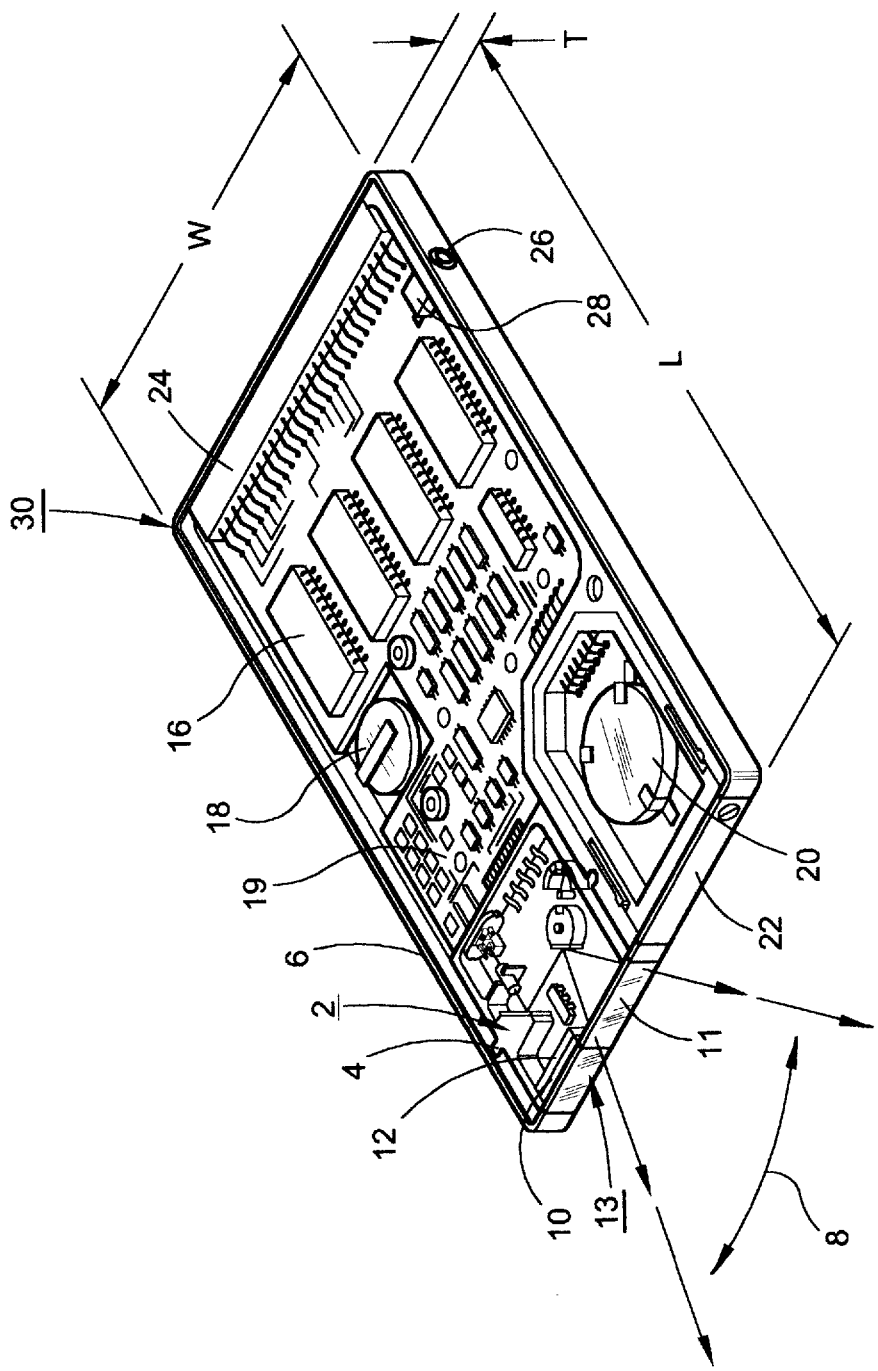
FIG. 1 illustrates a complete non-contact beam scanning data collection terminal housed in an industry standard PCMCIA card.

FIG. 1 shows a general layout of the integrated bar code scanning PCMCIA card scanner 30 of the present invention. The dimensions of the card are defined by international standards and for a type I PCMCIA card which is the thinnest of such cards, its thickness T, is typically 3.3 millimeters whereas the length L, is 85.6 mm and the width W, is 54 mm. It should be noted that type II and type III cards are slightly thicker. A novel low profile scan module 2 is secured to the plastic frame 6 of the card by a mounting feature 4. When scan module 2 is energized, a scanning beam is emitted through port 11 and scans a beam through a scan angle 8.

Light reflected from the target then enters port 13. Ideally port 13 includes an optical filter 10 so that light of unwanted wavelengths is rejected before reaching photo detector 12 which converts the signals from the target into electric signals. The electric signals are then processed by electronic circuits on thin circuit card 19 and information from the target is stored in memory devices such as memory element 16 which may be a non-volatile RAM.

A clock battery 18 supplies power continuously to a C-MOS clock circuit so that a time may be assigned to collected data if desired. A larger cell 20, typically a Lithium coin cell powers scan module 2 and the data processing circuits. Cell 20 itself is installed into a user replaceable module 22.

A female electrical connector 24 is provided for inputting special data or instructions, up or down loading information or powering the card depending on the application.

Port 26 is provided as an auxiliary data port for inputting special data from accessories, uploading or downloading information especially when it is desired to reduce wear and tear on connector 24. Other ports such as port 26 may be adapted for optical couplers, an ultrasonic transmitter/receiver, a fiber optic input/output, or a sub miniature power input for powering the device externally or for charging a cell and the like.

Now turning to FIG. 3, greater detail of the miniature beam scan module 2 is shown. The module 2 consists of a solid state laser assembly 32, a micro lens 34 such as a gradient index (GRIN) lens which is available in sizes on the order of 1 mm diameter, a mirror 38 for directing the beam from the laser to a scan mirror 40 attached to moveable core 45 for directing and scanning the beam out of port 11. A second port 13 allows reflected light to enter optical filter 10 which has photo detector 12 behind it. The scan mirror 40 is part of the inventive ultra thin scan mechanism 52 of FIG. 4A the present invention. It should be noted that mirror 38 is optional in that it merely allows for the specific optical layout described in FIG. 3 but the light beam from the laser could have been aimed directly at mirror 40.

Figure 4B:
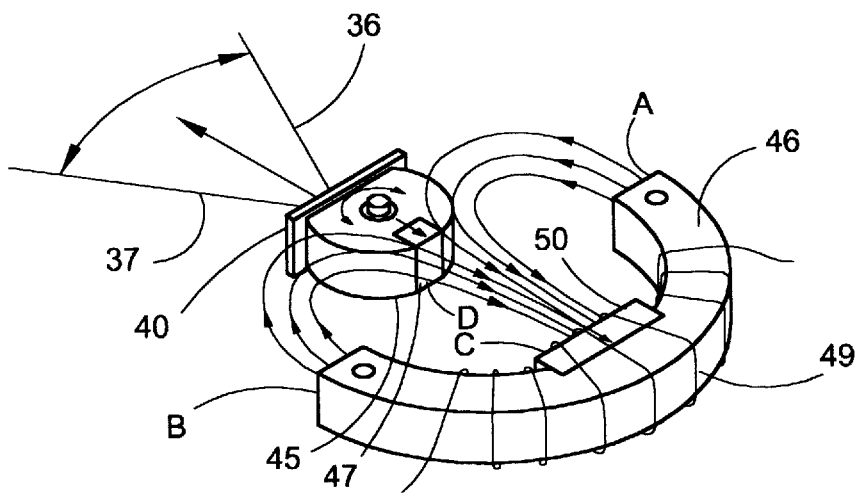
FIG. 4B is another view of the thin profile beam scan component shown in FIG. 4A.
Figure 6:
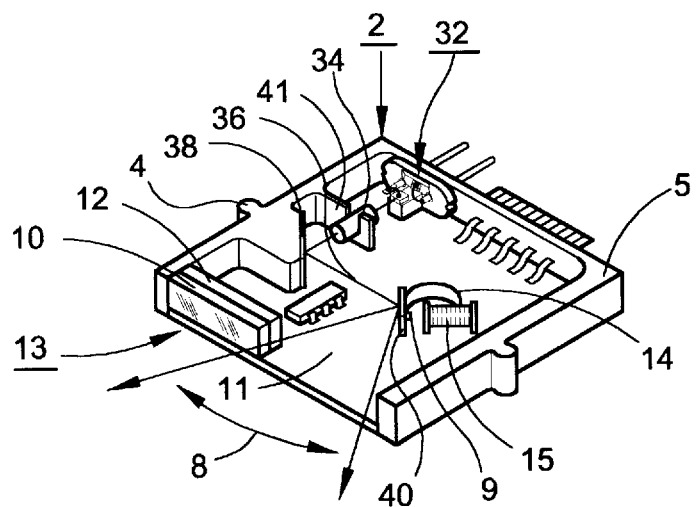
FIG. 6 illustrates another embodiment, of an ultra thin scan module.

Turning now to FIG. 4A, a preferred low profile scan mechanism for the scan card is depicted with a ferromagnetic core 46, typically made from soft iron having a thickness of about 1.5 mm and pole faces A and B. Core 46 has a small permanent magnet 50 which is about 3/10 mm thick mounted at its center. One of the poles of magnet 50 is ideally in contact with core 46 while its opposite pole C faces permanent magnet 47 which is installed in rotor 45. Magnet 50 creates an equal bias field of the same polarity which emanates from both poles A and B. For example if pole C of magnet 50 is south then poles A and B of core 46 will both be biased north.

Wrapped about core 46 is a winding 49. Typically winding 49 consists of about 800 turns of 48 gage wire and covers magnet 50. Near the gap of core 46, i.e. the space between pole faces A and B is a rotor 45. A preferred material for rotor 45 is injection molded plastic with a low coefficient of friction. Rotor 45 is typically about 1.5 mm high and can freely rotate on shaft 42. Permanent magnet 47 is affixed to rotor 45 so that its pole face D has the same polarity as biased pole faces A and B of core 46. Thus rotor 45 tends to seek the position shown in FIG. 4 with magnet 47 pointing towards magnet 50 since pole face D of magnet 47 tends to be equally repelled by both poles A and B.

When coil 49 is energized with alternating current, pole faces A and B are magnetically modulated in an opposite sense causing an imbalance of the field between poles A and B, which interacts with magnet 47 causing rotor 45 to rotatably oscillate on shaft 42. Magnet 47 tracks the unbalanced field changes between poles A and B at the frequency of the alternating current. The direction of oscillation of rotor 47 is indicated by Arrow 43. The angle of oscillation of rotor 45 is generally proportional to the strength of the current supplied to coil 49 and the permanent magnetic bias field supplied by magnet 50 tends to return rotor 45 to its neutral position. Typically magnet 47 is a high energy magnet made from Neodymium-Iron-Boron alloy and is about 1 mm×1 mm×1.5 mm high. Shaft 42 is preferably made from non-magnetic metal in order to minimize rotational friction between shaft 42, and rotor 45 and also to prevent magnetic field distortion. A short piece of polished Tungsten wire about ½ mm in diameter was used for a shaft since even so called non-magnetic stainless steel was found to be magnetic enough to cause frictional and distortion problems. Mirror 40, about 1.4 mm high×3 mm long attached to rotor 45, causes the beam from path 36 to reflect along path 37 and scans the beam across a target as rotor 45 rotatably oscillates.

It should be noted that the very small size and low friction of scan mechanism 52 makes possible high frequency rates of operation at low power and wide angles especially when operated at resonance. Also the strength of magnet 50 in conjunction with the rotational inertia of rotor 45 determines the resonant frequency of the scan element 44. (Increasing the strength of magnet 50 raises the resonant frequency of the scan element.) High speed operation on the order of several hundred scans per second is achievable due to the small mass of moving core 45.

The high speed scan greatly increases the productivity of scanning data acquisition systems of the present invention and constitutes an important feature of the present invention especially in cases where non-contact scanning must be carried out rapidly enough to read irregular and even moving targets such as a patient's wrist band.

Figure 8:
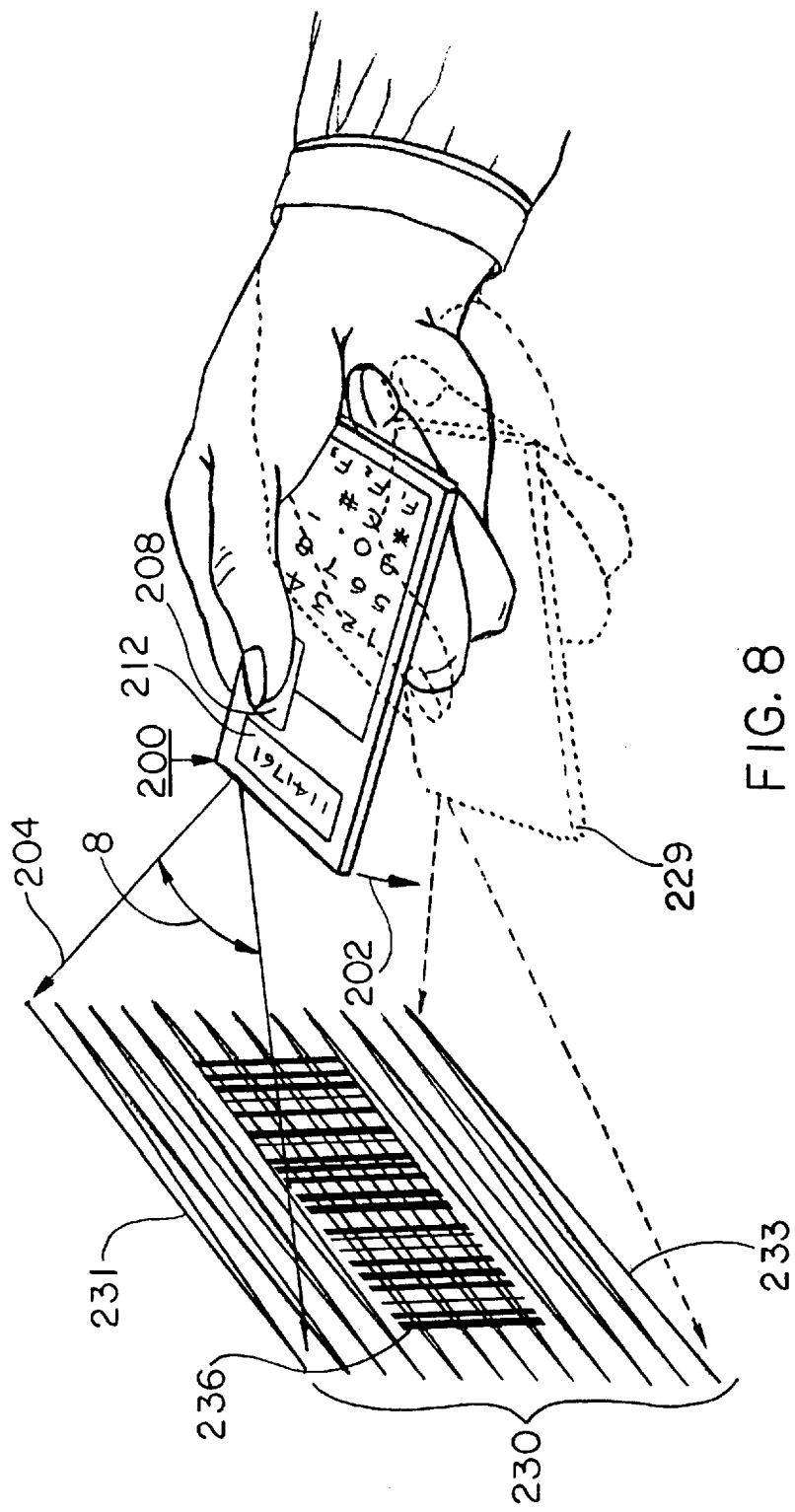
FIG. 8 illustrates a method of rapidly scanning a bar code target without the need for aiming.

As shown in FIG. 8 it is only necessary for the user to hold the scanner, in this drawing a PCMCIA Card Scanner, and "swipe" the scan card quickly past the general area in which the target is located. This method generates a closely spaced raster scan pattern 230. In doing so it is not likely that the tightly spaced lines of the raster scan pattern will miss the coded ID wrist band or other such targets. By this method the user purposely initiates scanning well outside the range of the target to generate scan lines beginning with line 231 and ending with line 233. This is far less tedious than aiming and high read rates and rapid data capture can thus be realized without fussy shoot and aim techniques of prior art scanners. (The older prior art 40 scan per second scanners have been found to be about an order of magnitude too slow to achieve the productive swipe generated raster of the present method.) An effective raster is naturally produced by allowing the human wrist to simply drop, as described above, while scanning takes place at several hundred scans per second.)

A data capture sequence on the order of 1/10 second for the present invention is thereby realized which dramatically conserves power of small batteries, reduces frustration and increases productivity.

SEALED MOVING BEAM SCAN SENSOR

Figure 10:
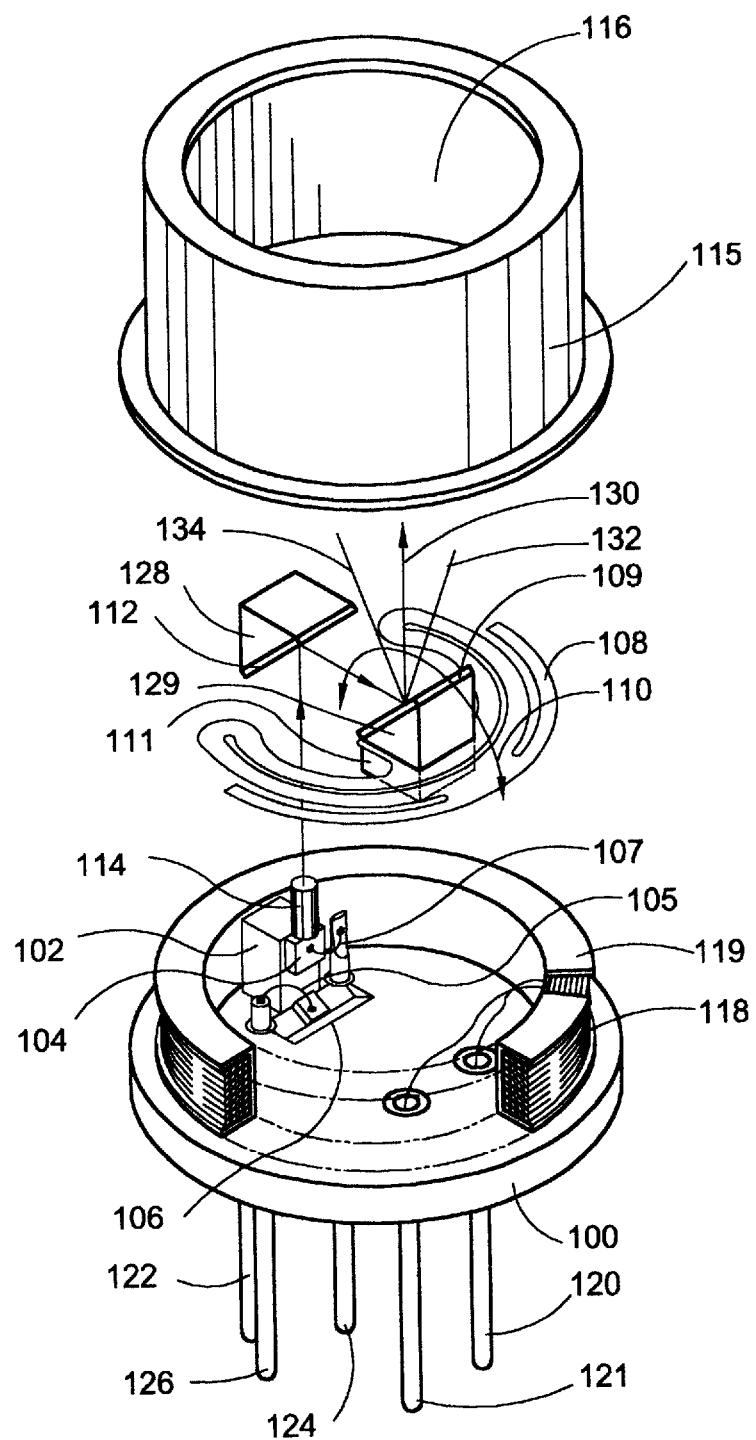
FIG. 10 is an exploded view of a non-contact scan system enclosable in a miniature housing similar to a TO-5 can which may be sealed against harsh environments.
Figure 11:
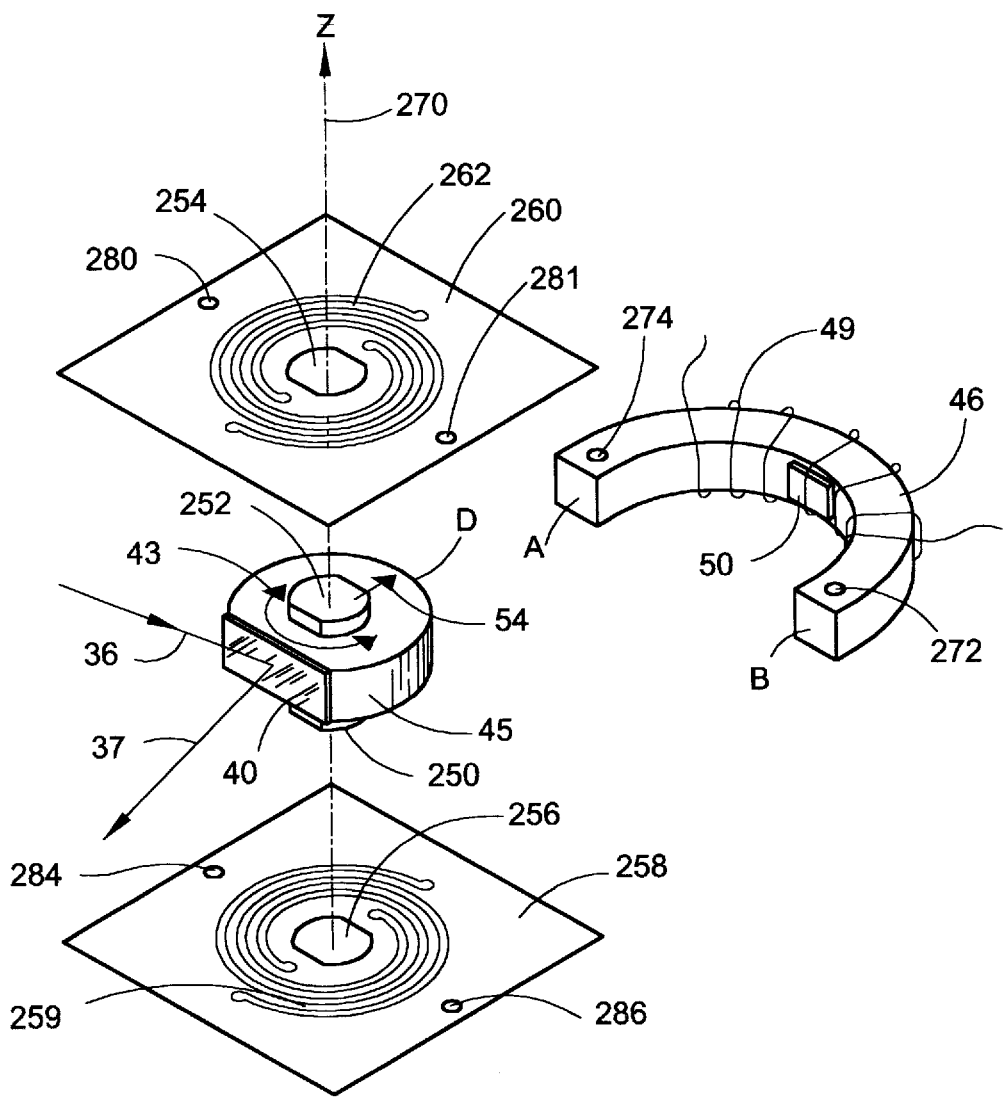
FIG. 11 illustrates a low profile shaftless scan element which may scan in one or more dimensions.

FIG. 10 shows an exploded view of a completely self contained scan module packaged in a can type package. This compact scan module contains all the elements necessary for a moving beam scanner sealed into a miniature enclosure having a size on the order of a TO-5 transistor housing. As such this new scan sensor can operate in harsh environments such as in chemical leak detectors as will be described later.

The components in the package include a light source 104 such as a laser diode chip 104, a heat spreader/diode mount 102, a micro lens 114, above the laser emission source, a first mirror 112, a moveable mirror 109, a flexible mirror mount/ suspension 108, a photo diode 106, a housing base 100, a housing cap 115, and a window 116. The assembly is preferably enclosed and hermetically sealed. Drive coil 118 serves to excite magnet 111 located preferably under mirror mount 129. The beam scanning mechanism of the scanner is essentially an axial scan element of the kind described in patent applications of which the instant application is a continuation-in-part. A coil-less version of the scan module is also contemplated in which the moving mirror element 109 is resonated by a piezeo bender wherein magnet 111 need not be affixed to the bottom of mirror mount 129.

Micro lens 114 can be a gradient index (GRIN) lens of the type manufactured by the Nippon Sheet Glass company. The lens 114 may be optically cemented to the laser diode or mounted just above it. Photo detector is preferably a PIN photo diode of the kind usually found in most laser diodes to monitor their power output however, this one is made larger, on the order of a few square millimeters. Diode 106 serves two purposes: 1) to monitor the steady light output of the light source 104, 2) to receive modulated light back from the target scanned. Well known AC coupling and filter techniques are used to separate the modulated, reflected light signal from the constant output of the light source 104. The signals may then be processed by external circuits.

As mirror 109 moves to scan the outgoing beam accosts the target to be read, it also tracks the moving beam spot and reflects the modulated light from the target upon photo diode 106. This feature provides an efficient light collection method.

HAND RASTERING METHODS OF USE

A preferred power conserving method of rapidly scanning data is now described in detail as follows.

A scanner is held, such as the one illustrated in FIG. 8, by a user whereupon s/he activates or "arms" the scanner with a key stroke or key stroke sequence. This could be two quick successive strokes of key 208 or a combination of key strokes. This wakes up appropriate data capture circuits such as a micro processor and arms the scan device making it sensitive to motion or the presence of a target, but the beam scan sequence is not yet begun. The user then quickly swipes the scanner past the general area in which the barcode to be read is located. The motion of this rapid swipe is sensed by a detector internally located within the scan terminal. Sensing of the motion then activates a timing circuit for a time on the order of 1/10 of a second during which scanning at a rate of preferably 200 to 1000 scans per second commences. Only one set of data is allowed to be entered during the short scan sequence even though many successful scans may have occurred in rapid succession. (The techniques for preventing such multiple entries are well known.). Thus, 20 to 100 scans take place in 1/10 second, after which the laser, and scan device and other circuitry are automatically shut off. The scanner may still remain armed and ready for the next swipe. When the user no longer wishes to scan, a key stroke or combination of key strokes can be used to disarm the scanner so that further movement will not needlessly waste power.

FIG. 8 also illustrates an important aspect of the "credit card" form factor, wherein the scanner is configured generally as a rectangular prism of about several inches in length and width and substantially smaller in thickness, preferably less than about ½ inch and more preferably less than about ¼ inch. The user can easily orient the scanner to the bar code to be read by bringing one dimension perpendicular to the bars of the bar code. Preferably as shown, the scanner generates scan lines in the plane of the scanner (i.e. in the plane defined by the length and width of the scanner.)

Other combinations of this general method are effective. For example, the scanner may be turned on and operated in a continuously on mode while scanning target after target then turned off after the scan session is finished. Although this latter method is not highly conservative of power it can be very productive when item after item is to be scanned such as at a check out counter or during inventory work.

Automatic arming and triggering mechanisms are described later.

RELATIVE MOTION SCAN ACTIVATION METHODS

Several low power scan activation methods have been found to be effective for use in the present invention. It should be pointed out that in two earlier patent applications by the instant applicant various methods of scan sequence initiation were described: an inertial scan actuator method was described in U.S. Pat. application No. 5,357,101 now U.S. Pat. No. 5,371,347 and in U.S. patent application Ser. No. 07/776,663 now U.S. Pat. No. 5,371,347 wherein the use of certain relative motion detectors were described to automatically initiate scan sequences.

The latter type of scan initiator utilizes a relative motion detector since it inherently responds only to relative motion between a detector and a target combination and not to vibration or inertial movement of the scanner itself. Various security alarm sensors operate in this manner in that they can detect the motion of a moving object in front them but if attached to an object such as a small appliance they can also detect they have been moved with respect to their surroundings.

A preferred scan initiation/trigger method of the present invention uses a relative motion detector of this kind to initiate the scan sequence in combination with high speed balanced scan devices and time-out circuits making them immune to false triggering caused by vibration while operating to conserve power and time.

When the user wishes to scan a target with the present invention s/he may touch a power switch or "arming" switch such as switch 208 in FIG. 8. This activates low power sleeping circuitry immediately prior to the actual scan sequence. The sleeping circuitry activates the relative motion sensor circuit and may also activate sleeping data capture microprocessor circuitry making it ready to accept data. The user then "swipes" the scanner 200 past general area 230 to be scanned without regard to the exact location of the target which may be a bar code target on a patient's wrist band 206 as shown in FIG. 7.

The relative motion detector in the scanner senses relative movement of the target/scanner combination which causes internal circuitry to turn on the light beam and the high speed scan device momentarily for only a fraction of a second which may be on the order of 1/10 second thus conserving power. During this short timed cycle a tightly spaced raster pattern in area 230 is created consisting of many closely spaced scan lines such as line 231. Preferably several hundred scan lines per second are generated which are spaced so tightly that it is unlikely that the target will be missed. Usually several successful scans occur during one such sequence but the data capture circuitry is programmed to only record one set of data per packet. A time lapse on the order of one second can be programmed into the data recording circuit before it can accept and record another element of data. It is not necessary or desirable for the data capture circuitry to turn the scanner off, the time out circuit does so. Once the data capture circuitry determines that the scan has been successfully recorded a beep can indicate that the data was captured whereupon the data processing circuit can go back to its sleep mode to save power.

Figure 7:
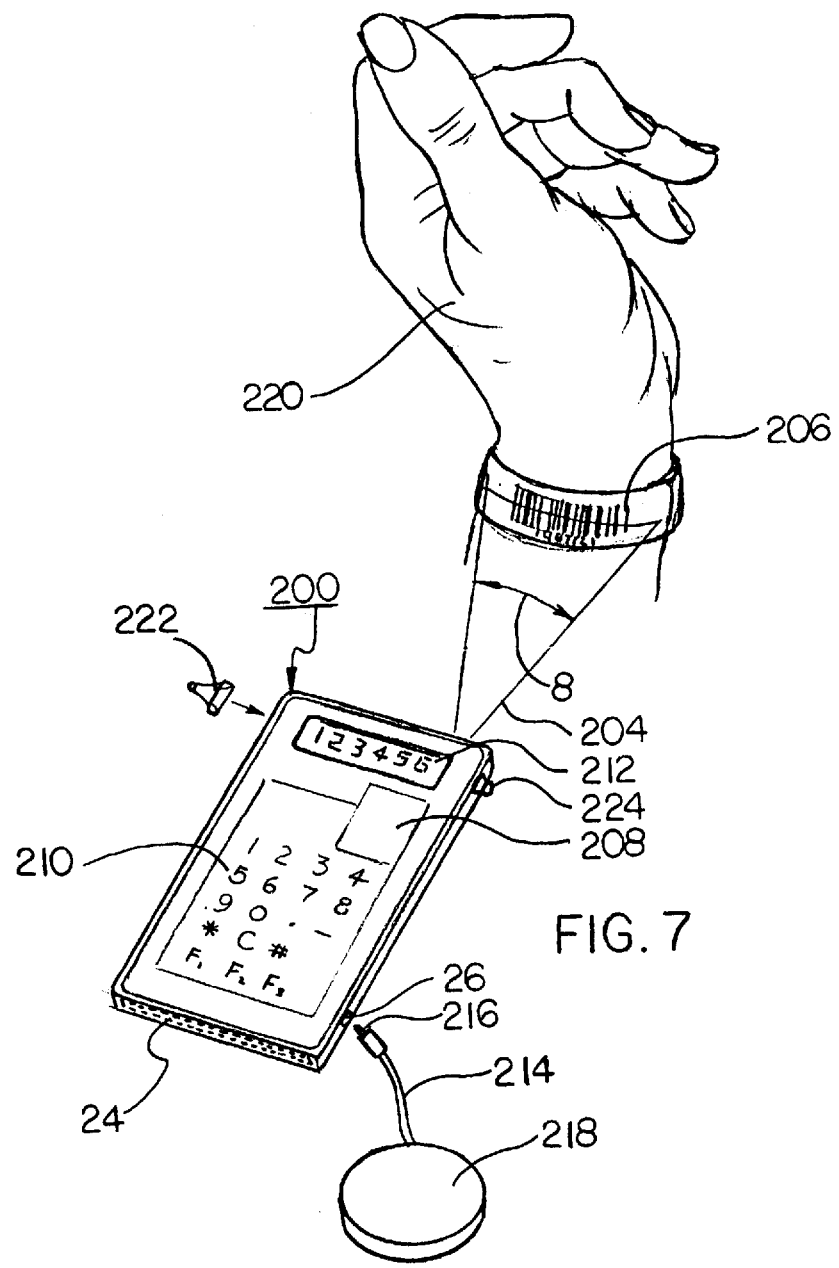
FIG. 7 illustrates a PCMCIA card scanner adapted for collection and loading of medical data.

In the administration of medication, bottles bearing bar coded identification labels may be picked up and passed by a scanner such as that shown in FIG. 7. In this case the label is moved past the stationary scanner enabling the user to read display 204 which can confirm proper dosage, patient identity, special instructions or the like. The quickness of operation and power conservation benefits are still preserved as shown by this example wherein the versatile benefits of the relative motion detection scan initiation method have been illustrated.

OTHER SCAN SEQUENCE TRIGGERS

Ambient Light Trigger

In most work environments ambient light is available which is detectable by miniature photo detectors such as photo transistors, photo diodes, or photo resistors. Such a photo detector forms the front end of a preferred relative motion detector by allowing it to drive a preamplifier circuit. A low power C-MOS amplifier can be used for the photo detector preamplifier to conserve power. A current to voltage converter is a well known preamplifier circuit. The signal from the preamplifier is then fed through an appropriate filter such as a low pass, notch, or band pass filter circuit which is immune to the flicker of typical room lighting, which typically has a flicker rate of 120 Hz with a period of 8 ms. Only slower changes in received light are thus detected. When an object is passed or passes in front of the photo detector a change in reflected ambient light is registered. The amplitude of this rate of change of ambient light triggers a comparator which then automatically initiates the aforementioned scan cycle.

The existing photo detector of the scanner itself can serve as the detector to register a change in the received ambient light to initiate a scan sequence.

The ambient light need not be visible to the human eye. The method may be adapted to work with changes in infrared light which is radiated by all objects so that relative changes in received radiation may be detected. An infrared pass filter can be used to enhance this sensor.

Internal Light Source Trigger

Normally, scanned information signals occupy a particular band width (say 10 KHz and above) . If the detector of the scanner is swept past an object or if an object is moved in front of the detector while the internal light source of the scanner is on, then by using appropriate electronic filtering as previously described, the low frequency signal modulation received by the photo detector is then used to initiate the scan sequence by turning on the scan element, triggering the scanner, activating a microprocessor and the like in any combination desired. Although this method uses slightly more power than the ambient light method it is well suited to applications where the ambient light is low such as in a darkened patient's room. Again use of electronic filters are employed to avoid false triggering due to ambient light flicker. A manual switch can also be added to the scan device to turn all circuits off if long periods between usage is contemplated.

Sonic Triggering

Miniature Ultrasonic transmitter/receiver combinations may also be use to sense relative motion. The Panasonic company makes a line of such ultrasonic components which may be used in toys and other products to activate them. These are employed in the same manner as the photo detectors for relative motion or proximity detectors except that sonic waves interacting with a target are detected and used to automatically trigger scan sequences.

Figure 12:
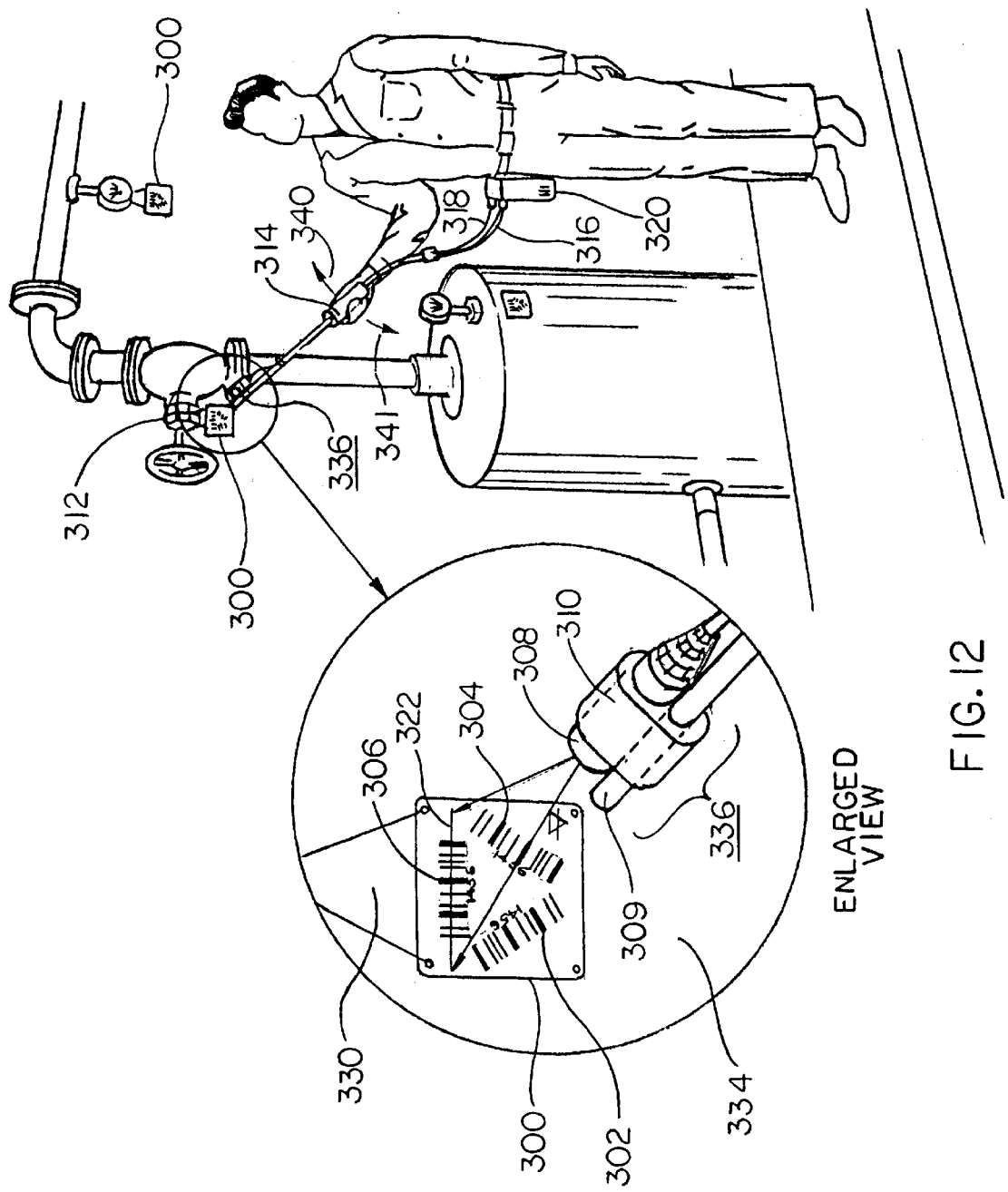
FIG. 12 illustrates a bar code reading gas sampling probe and an omni directional readable barcode tag.

A novel sonic detector may be incorporated into scanners of the present invention wherein a miniature microphone element is built into the scanner. Scanning is initiated by simply rubbing the scanner or tapping it so that a preset noise threshold is reached thereby initiating a timed scan sequence. This type scan actuator is useful in industries where pipe couplings and valves are monitored for leakage. A person wearing protective work gloves and cannot easily pull a trigger. He may also have to climb ladders to get to a valve with a leak detector strapped to his body with a leak sniffing probe in one hand. The leak sniffing probe can have a barcode scan head attached to it as shown in FIG. 12. The user may then simply tap the probe near a bar coded identification tag on the valve to be sniffed to initiate the scan sequence. The valve identity is then logged in and the leak detection probe sniffs for a leak and that data is also logged into the terminal.

(The application shown in FIG. 12 is typical of harsh or dangerous environments where a completely sealed scanner may be a necessity.)

Another method of sonic triggering is to include a small moveable object which could rattle in the scanner. The previously mentioned microphone element in the housing would hear the rattle and if sufficient movement of the scan head occurred the internal noise will rise above a set threshold to initiate scanning. This technique can work independently of gravity and can be set to have good immunity to false triggering.

Gravity Sensing Trigger

A very small tilt type switch, such as a mercury switch has been found to work well as a scan initiation trigger when it changes state due to a change in orientation with respect to gravity or to acceleration and has been used to start a timed scan sequence. This type switch can be positioned within a scanner to initiate scanning when the scanner is pointed downwards or swiped. A timer circuit may be used in conjunction with the tilt switch to initiate a non-interruptable scan sequence which terminates itself after a short predetermined time-out period to conserve power. A tilt switch allows operation of a scan head without the need for an external switch which may leak under water when a diver uses a scanner.

In another embodiment the user may "arm" the tilt detection circuit by touching a pad such as pad 208 in FIG. 7 so that when the scanner is tilted a short scan sequence is initiated. The circuit need not be armed after each tilt but only once for a series of scannings. The arming switch may then be turned off when the scanner is not in use to conserve power.

Inertial Trigger Systems

A strain resistive element with a small mass attached to it can also be set up as an acceleration detector as can a magnet and coil arrangement to sense acceleration. These can be employed in various permutations of scan initiation methods described above wherein one does not have to actuate a scanner with a trigger finger.

Magnetic Field Triggers

The Honeywell company makes semiconductor sensing integrated circuits which can sense extremely small changes in magnetic fields. These can sense small changes in their orientation with respect to the magnetic field of the earth or other magnetic objects like a compass producing an electronic output. With this kind of sensor any kind of change in position of the scanner can be made to initiate a scan.

A hall sensor included in a scan head can also be used to initiate operation of a scanner. If a level of security is needed the user may wear a magnetic ring on a finger which is brought into proximity within the area of the scanner containing the hall switch. This provides a somewhat obscure and uncommon method of initiating a data collection scan sequence to prevent accidental or unauthorized data entry and can also be sealed against harsh environments.

HAND HELD APPLICATIONS AND SCANNING METHODS

The card scanner held as illustrated in FIG. 8, is ideal for close non-contact scanning of irregular objects subject to movement such as patients bar coded wrist band. Switch 208, is provided on the device to activate sleeping circuitry prior to the actual scan sequence. The conveniently mounted switch 208, may also have multiple positions for selecting various scan patterns and scan angles.

One or combinations of the scan initiation trigger devices described in the present invention may be incorporated into a scanner to activate it automatically during use for special applications. Since the scan elements used in the scanners described herein consume very little power they can be operated from small batteries included in their housings for cordless operation.

In the cordless mode of operation, where the scanner is configured as a bar-code reader, information may be stored in a nonvolatile memory within the unit for down loading later to a host terminal located remotely using well known schemes for data transmission. Radio frequency, infrared, sonic, fiber optic and the like are methods which can be readily adapted for information transfer. An optical link, 28 located at the back end of a card scanner shown in FIG. 1, is an ideal location for a typical data up/down load link.

The use of scan elements capable of hundreds of scans per second when used in a card scanner, produce highly effective, dense, raster patterns and are ideally suited to low cost card or pen-size bar-code readers capable of reading low profile one or two dimensional bar-codes.

MEDICAL DATA COLLECTION APPLICATIONS

Turning now to FIG. 7 we see elements of a card scanner medical data collection system depicted.

Scan terminal 200 is in the form of a standard PCMCIA data collection card and is adapted for medical data entry.

A patient's identification wrist band 206 is read utilizing methods previously described.

Several scan lines scan wrist band 206 to enter a patients identity which is presented on display 212 then entered by depressing a keypad key. Preferably when each piece of data is entered it is time and date tagged by an internal clock in the terminal.

Various accessories such as thermometer element 222 can be plugged into terminal 200. Thermometer element 222 is operated by pointing it into the ear of a patient and an actuator switch 224 on the terminal is momentarily pressed whereupon the patients temperature is read, and presented on display 212, then logged in by touching entry pad 208. Numerous companies make such infrared sensing thermometers.

Other accessories can be plugged into the terminal such as stethoscope 218 to measure a patient's pulse or devices to measure blood pressure and other vital signs. Several such miniature sensing elements are now available which can be adapted to the inventive scan card terminal and it is possible to adapt such a terminal to plug into electrocardiogram equipment and digitally record a patients heart behavior.

In the dispensing of medication mistakes can occur by administering the wrong medicine or giving it at the wrong time or not at all. These errors can be largely eliminated by scanning a bar code on the medication whereupon display 212 validates the correctness and other information such as dosage to the caregiver by referring to an internal data base which has been loaded into the terminal. Thus an irrefutable information record is created. Such information can be periodically down loaded into a master data base to chart, track, and analyze patient status and care thereby reducing paper work and mistakes.

LOW PROFILE SINGLE PIECE LENS MOUNT

Figure 14:
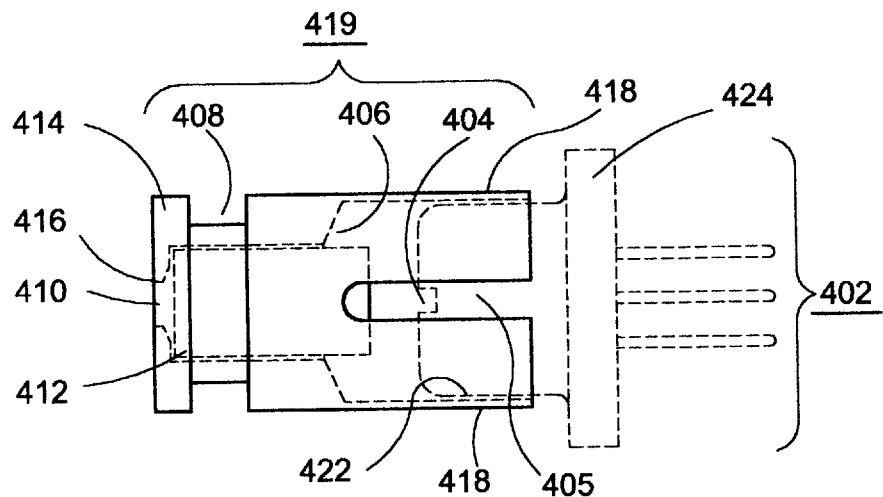
FIG. 14 illustrates a single piece lens holder mounted to a laser diode.

Now turning to FIG. 14, a low profile single piece lens mount 419 is illustrated. Lens mount 419 is made from a single piece of material. Plastic or metal are suitable. The lens mount preferably houses a small diameter gradient index lens 412. Lens 412 is cemented into holder 419 by placing a liquid adhesive into area 406 whereby capillary action causes the adhesive to flow around the lens to hold it firmly in the holder.

Two opposing slots such as slot 405 are incorporated into the body of lens holder 419. The slots allow the thin wall lower body portion 418 of lens mount 419 to expand allowing mount 419 to grasp the top cap portion 422 of a commercial laser diode.(Although the base 424 of laser diodes are held to exacting tolerances the cap portions are notorious for their variation in diameter.)

After lens 412 is cemented into mount 419 the assembly is pushed onto laser diode cap 422, focused and cemented to the laser diode cap with instant setting low viscosity adhesive such as a cyanoacrylate type.

Due to the slight expansion of the bottom portion of the bottom region 418 a small space is generated between it and cap 422. This space causes the instant adhesive to flow and fill the space due to capillary action firmly bonding the lens mount assembly to the laser cap.

A groove 408 is also provided in lens mount 419 to facilitate focusing just prior to bonding.

Figure 13:
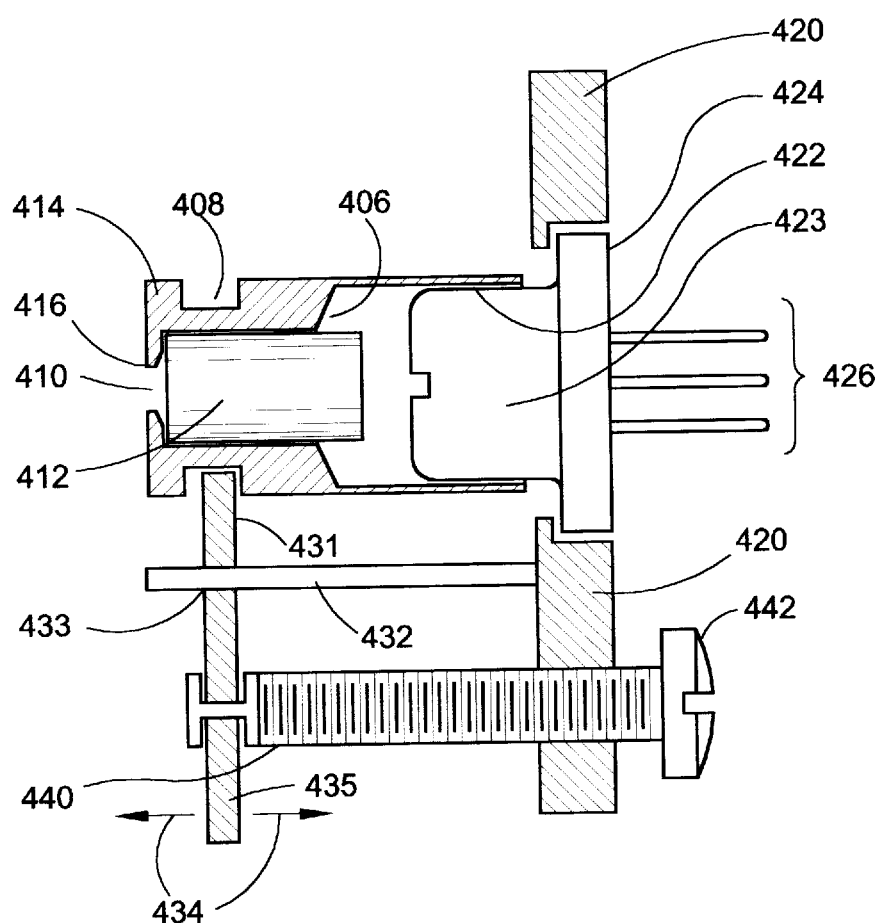
FIG. 13 illustrates a narrow profile lens holder and focusing system.

Turning to FIG. 13 a focus setup is depicted. A laser diode 423 is firmly mounted in fixture 420 and powered through leads 426. A lens holder 414 with cemented lens 412 is pressed onto laser cap 422.

Lever arm 431 has one end inserted into groove 408. The lever arm pivots in fixed member 432 at fulcrum point 433. When screw 442 is turned the lever arm moves at end 435 according to direction arrows 434 thereby allowing precise positioning of the lens holder 414 with respect to laser cap 422. Bonding is then completed.

This lens holder and focus method is very low cost and low profile and allows the precise base 424 of the laser 423 to be free for mounting into other equipment.

Figure 15:
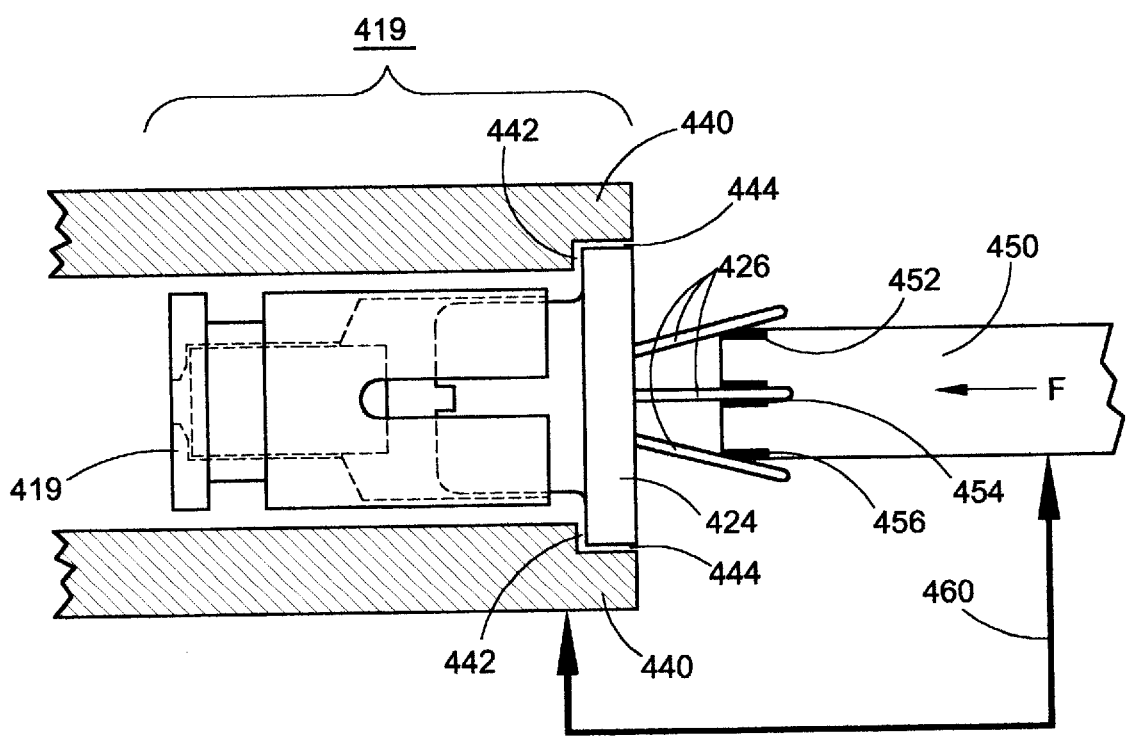
FIG. 15 illustrates a laser focus device of FIG. 14 spring loaded to a circuit board.

FIG. 15 depicts the final mounting of the focused laser, mount, and lens into a heat sink 440. Since the base 424 of the laser has not been used as a reference to mount the lens holder as do prior art devices (such as described in U.S. Pat. Nos. 5,121,188 and 5,111,476), the entire assembly may be pushed into heat sink 440 with the diode base 424 in contact with the heat sink. A circuit board 450 with metalized contact areas 452, 454, and 456 is pushed into laser diode leads 426 with a force in direction F. A frame 460 is schematically depicted which holds the circuit board 450 fixed with respect to laser heat sink 440. This arrangement needs no solder since the laser leads 426 have spring qualities. A particular benefit of this assembly is that the focused laser assembly may be replaced in the field without a soldering iron.

While various embodiments of the invention have been set forth, variations will no doubt occur to those skilled in the art without departing from the spirit and scope of the present invention.

What is claimed is:

1. A portable light beam scanning system comprising:

a housing formed from a computer card, said housing being shaped as a rectangular prism, said housing having a uniform thickness of about 3.3 mm and generally sized so as to be holdable in a person's hand during data collection;

a light beam scanner within said housing emitting a scanning beam from said housing toward a target field; and an electrical power source coupled to said light beam scanner for powering said scanner.

2. The system of claim 1, wherein said housing is configured as a PCMCIA card.

* * * * *